(12) United States Patent
Turnquist

(10) Patent No.: US 6,360,343 B1
(45) Date of Patent: Mar. 19, 2002

(54) DELTA TIME EVENT BASED TEST SYSTEM

(75) Inventor: James Alan Turnquist, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/259,401

(22) Filed: Feb. 26, 1999

(51) Int. Cl.[7] .............................................. G01R 31/28
(52) U.S. Cl. ........................ 714/731; 714/725; 714/730
(58) Field of Search ................................ 714/724, 725, 714/730, 731, 726, 727, 728, 729; 713/400, 500

(56) References Cited

U.S. PATENT DOCUMENTS

| 4,231,104 A | | 10/1980 | St. Clair ...................... 713/500 |
| 5,274,796 A | | 12/1993 | Canner ........................ 713/400 |
| 5,282,213 A | * | 1/1994 | Leigh et al. ................. 714/724 |
| 5,646,521 A | * | 7/1997 | Rosenthal et al. ......... 324/158.1 |
| 5,937,202 A | * | 8/1999 | Crosetto ....................... 712/19 |

* cited by examiner

Primary Examiner—Albert Decady
Assistant Examiner—Emeka J. Amanze
(74) Attorney, Agent, or Firm—Muramatsu & Associates

(57) ABSTRACT

An event based test system for testing an electronics device under test (DUT) by supplying a test signal to the DUT and evaluating an output of the DUT at a timing of a strobe signal. The event based test system includes an event memory for storing timing data of each event which represents a time difference between two adjacent events, an address sequencer for generating address data for accessing the event memory, a timing count logic for summing the timing data to produce an overall time of each event relative to a predetermined reference point, an event generation circuit for generating each event based on the overall time for formulating the test signal or strobe signals, and a host computer for controlling an overall operation of the event based test system.

8 Claims, 6 Drawing Sheets

| | Clock Count | Vernier Count | Vernier Sum | Total Time |
|---|---|---|---|---|
| Event 1 | 1 | $\frac{3}{16}$ | $\frac{3}{16}$ | $1\frac{3}{16}$ |
| Event 2 | 1 | $\frac{7}{16}$ | $\frac{10}{16}$ | $2\frac{10}{16}$ |
| Event 2 | 1 | $\frac{8}{16}$ | $\frac{18}{16} \rightarrow \frac{2}{16}$ | $4\frac{2}{16}$ |

DELTA TIME EVENT BASED TEST SYSTEM

FIELD OF THE INVENTION

This invention relates to a semiconductor test system which generates test signals for testing electronics devices, and more particularly, to an event based semiconductor test system for producing events of various timings to be used to evaluate a semiconductor device under test wherein the timing of each of the events is defined by a time length from the previous event.

BACKGROUND OF THE INVENTION

In testing semiconductor IC devices by a semiconductor test system, such as an IC tester, a semiconductor IC device to be tested is provided with test signals at its appropriate pins at predetermined test timings. The IC tester receives output signals from the IC device under test generated in response to the test signals. The output signals are strobed, i.e., sampled by strobe signals with predetermined timings or delay times to be compared with expected data to determine whether the IC device functions correctly.

Traditionally, timings of the test signals and strobe signals are defined relative to a tester rate or a tester cycle of the semiconductor test system. Such a test system is sometimes called a cycle based test system. An example of timing relationships in such a cycle based test system is shown in FIGS. 1A–1E. In a cycle based test system, the semiconductor device (DUT) is tested by providing a cycled pin pattern vectors at a programmed data rate (tester cycle) to a formatter with timing edges to produce the desired wave forms (test signals) or strobe signals.

In the example of FIG. 1, based on a reference (system) clock shown in FIG. 1A, a cycle based test system produces tester cycles of FIG. 1B. The test system generates test signals of FIGS. 1C and 1D and a strobe signal of FIG. 1E. The timings of the test signals and strobe signal are defined with reference to the tester cycle of FIG. 1B. For example, the timings of the test signal of FIG. 1C are defined by the time lengths of T1, T2 and T3, respectively, with reference to start edges of the corresponding tester cycles. The timings of the test signal of FIG. 1D and strobe signal of FIG. 1E are similarly defined relative to the tester cycles.

As noted above, generally, the various timings of the tester cycle, test signals and strobe signals, such as in the above example, are generated based on the reference clock as shown in FIG. 1A. The reference clock is produced by, for example, a crystal oscillator provided in the IC tester. When the required timing resolution in an IC tester is equal to or an integer multiple of the highest clock rate (shortest clock cycle) of a reference clock oscillator, timing signals can be generated by simply dividing the reference clock by a counter or a divider and synchronizing the divided output with the reference clock.

However, IC testers are usually required to have timing resolution higher than the highest clock rate, i.e., the shortest time period, of a reference (system) clock. For example, in the case where a reference clock available in the market is 10 ns (nanosecond), but an IC tester needs to have timing resolution of 0.1 ns. Furthermore, the IC testers dynamically change such various timings in a cycle by cycle basis based on a test program.

To generate such timing signals with the timing resolution higher than the reference clock rate, it is known in the prior art that such timings are described by timing data in a test program. The timing data is a combination of an integer multiple of the reference clock time interval and a fraction of the reference clock time interval. Such timing data is stored in a timing memory and read out at each cycle of the test cycle. Thus, in each test cycle, test signals and strobe signals are generated with reference to the test cycle, such as a start point of each cycle, based on the timing data.

There is another type of test system called an event based test system wherein the desired test signals and strobe signals are produced by data from an event memory directly on a per pin basis. As of today, an event based test system is not actualized in the market but under investigation. In an event based test system, events, which are any changes in the logic state, such as rising and fallings of test signals and strobe signals, are defined with respect to time length from reference time points. Typically, such reference time points are timings of previous events such as shown in the example of FIGS. 3A–3K. For producing high resolution timings, the time length between the events is defined by a combination of an integer multiple of a reference clock time interval and a fraction of the reference clock time interval.

In the example of FIG. 3, the timing of Event 1 is 1(3/16)ns (nanosecond) from a start time "0" as in FIG. 3I. The timing of Event 2 is 1(7/16)ns apart from Event 1 as shown in FIG. 3J and the timing of Event 3 is 1(8/16)ns after Event 2 as shown in FIG. 3K. More details of the timing generation in the event based test system will be provided later with respect to the present invention.

In an event based test system, since the timing data in a timing memory (event memory) does not need to included each and every test cycle data, a format of the timing data is significantly simplified, which also simplifies a process for producing the test signals and strobes. In the event based test system, the timing data for each event stored in an event memory is expressed by a time difference between the current event and the last event. Since such a time difference between the adjacent events is very small, a size of the data in the memory can also be small, resulting in the reduction of the memory capacity.

Moreover, in computer aided design (CAD) systems widely used today for designing a semiconductor device such as an LSI and VLSI, most logic simulators in the CAD system utilizes event based test signals for evaluating the semiconductor device. Therefore, an event based test system enables a more direct linking ability between the design data produced by the CAD system in the design stage and the test signals to be generated using the design data.

SUMMARY OF THE INVENTION

Therefore, it is an object of the present invention to provide an event based semiconductor test system for producing test signals and strobes based on event data stored in an event memory to evaluate a semiconductor device.

It is another object of the present invention to provide an event based semiconductor test system wherein the timing of each of the events is defined by a time length (delta time) from the last event.

It is a further object of the present invention to provide an event based semiconductor test system for producing test signals and strobes based on event information whose time length (delta time) from a previous event is defined by a combination of an integer multiple of a reference clock period and a fraction of the reference clock period.

It is a further object of the present invention to provide an event based semiconductor test system for producing test signals and strobes directly with the use of the timing data in an event memory.

It is a further object of the present invention to provide an event based semiconductor test system which is capable of directly using data produced by a test bench of a CAD system in a design stage of the semiconductor device under test for generating test signals and strobes.

The present invention is an event based test system for testing an electronics device under test (DUT) by supplying a test signal to the DUT and evaluating an output of the DUT at a timing of a strobe signal. The event based test system includes: an event memory for storing timing data of each event formed with an integer multiple of a reference clock period (integral part data) and a fraction of the reference clock period (fractional part data) wherein the timing data represents a time difference between two adjacent events, an address sequencer for generating address data for accessing the event memory to read out the timing data therefrom, a timing count logic for summing the timing data to produce an overall time of each event relative to a predetermined reference point wherein the timing count logic includes a delay means for providing an additional delay of one reference clock period every time when a sum of the fraction exceeds the reference clock period, an event generation circuit for generating each event based on the overall time for formulating the test signal or strobe signals, and a host computer for controlling an overall operation of the event based test system through a test program.

In a further aspect of the present invention, the event memory is comprised of a clock count memory for storing the integral part data of the timing data of each event, a vernier memory for storing the fractional part data of the timing data of each event, and an event type memory for storing data representing a type of each event corresponding to the timing data in the clock count memory and the vernier memory.

In a further aspect of the present invention, the timing count logic for summing said timing data is comprised of a down counter for presetting the integral part data therein and down counting the integral part data for producing a delay time which is an integer multiple of the reference clock period, a multiplexer for inserting one clock delay in the delay time from the down counter, thereby producing an event start signal, and an adder for adding the fractional part data of a current event from the event memory to fractional part data of previous events, thereby producing a vernier sum data, where the adder generates a carry signal every time when the result of adding the fractional part data exceeds the reference clock period, wherein the carry signal triggers an additional delay of the event start signal equal to one period of the reference clock.

In a further aspect of the present invention, the event generation circuit is comprised of a demultiplexer for selectively providing the event start signal from the timing count logic based on event type data from the event memory, a plurality of variable delay circuits for receiving the event start signal from the demultiplexer where each of the variable delay circuits provides an additional delay defined by the vernier sum data from the timing count logic, means for producing variable offset delay between test signals.

According to the present invention, an event based semiconductor test system is capable of producing test signals and strobes based on the event data stored in the event memory to evaluate a semiconductor device. The timing of each of the events is defined by a difference of time length (delta time) from the last event. The test signals and strobes are produced based on event information whose delta time from the previous event is defined by a combination of an integer multiple of the reference clock period and a fraction of the reference clock period.

DETAILED DESCRIPTION OF THE PREFERRED EMBODIMENT

Figure 1A:
FIGS. 1A–1E are timing charts showing timing relationships among various signals in a cycle based test system in the conventional technology.
Figure 1B:
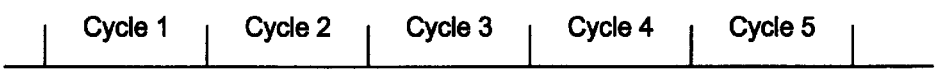
Figure 1C:
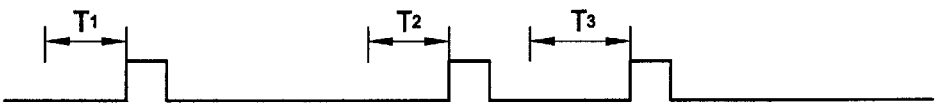
Figure 1D:
Figure 1E:
Figure 2:
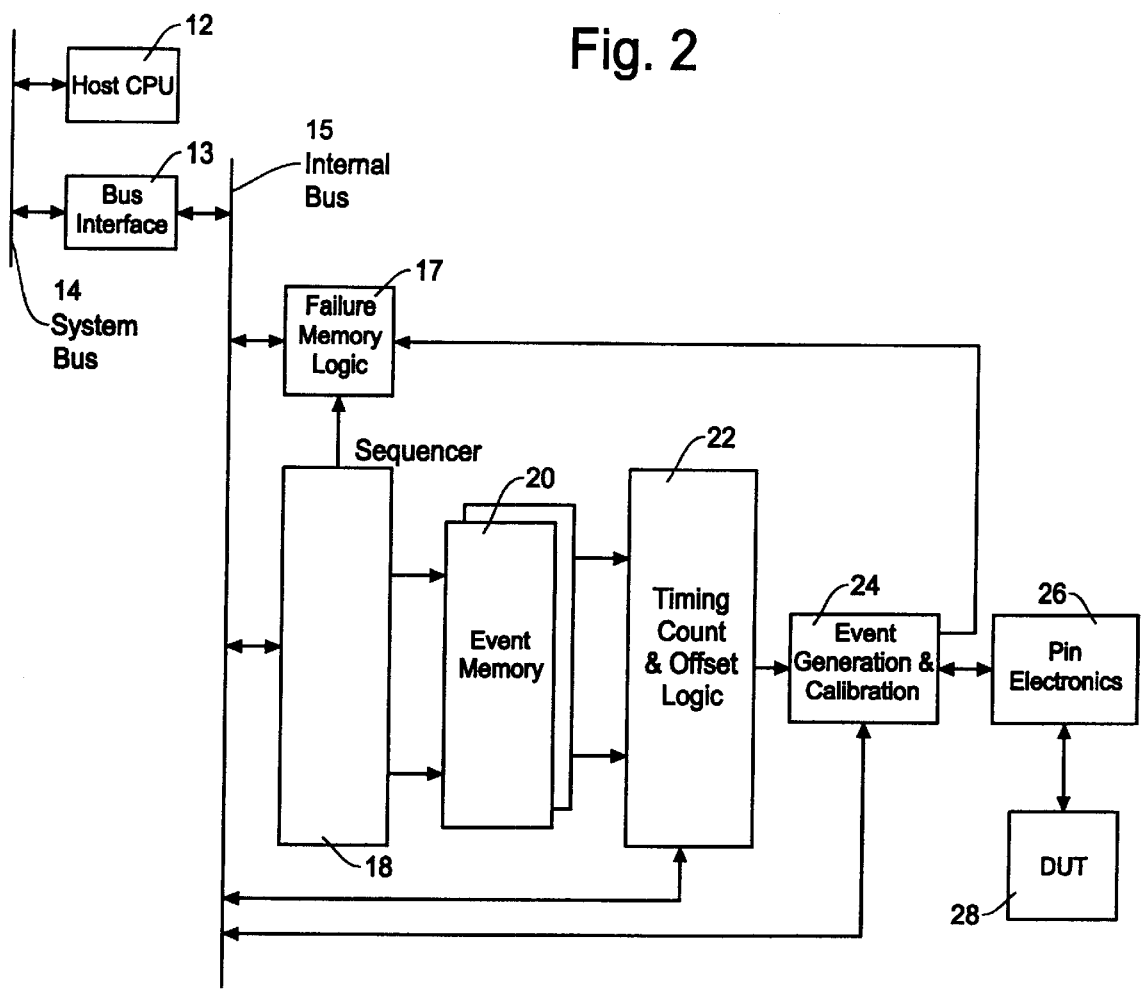
FIG. 2 is a schematic block diagram showing an example of structure in an event based test system for incorporating delta timing event generation of the present invention.

FIG. 2 is a schematic block diagram showing an example of structure in an event based test system of the present invention. The event based test system includes a host computer 12 and a bus interface 13 both are connected to a system bus 14, an internal bus 15, an address sequencer 17, a failure memory 17, an event memory 20, a timing count and offset logic 22, an event generation and calibration 24, and a pin electronics. The event based test system is to evaluate a semiconductor device under test (DUT) 28, which is typically a memory IC or a microprocessor IC, connected to the pin electronics 26.

An example of the host computer 12 is a work station having a UNIX operating system therein. The host computer 12 functions as a user interface to enable a user to instruct the start and stop operation of the test, to load a test program and other test conditions, or to perform test result analysis in the host computer. The host computer 12 interfaces with a hardware test system through the system bus 14 and the bus interface 13. Although not shown, the host computer 12 is preferably connected to a communication network to send or receive test information from other test systems or computer networks.

The internal bus 15 is a bus in the hardware test system and is commonly connected with most of the functional blocks such as the sequencer 18, failure memory 17, timing count and offset logic 22, and event generation and calibration 24. An example of the sequencer 18 is a test processor exclusive to the hardware test system and is not accessible by a user. The sequencer 18 provides instructions to other functional blocks in the test system based on the test program and conditions from the host computer 12. The failure memory 17 stores test results, such as failure information of the DUT 28, in the addresses defined by the sequencer 18. The information stored in the failure memory 17 is used in the failure analysis stage of the device under test.

One of the jobs of the sequencer 18 is to provide address data to the event memory 20 as shown in FIG. 2. In an actual test system, a plurality of event memories 20 will be provided, each of which may correspond to a test pin of the test system. The event memory 20 stores the timing data for each event of the test signals and strobe signals. As will be described in more detail later, the event memory 20 stores the event data in two separate manners, one for storing the timing data which is integer multiple of the reference clock, and the other for storing the timing data which is fractions of the reference clock. In the present invention, the timing data for each event is expressed by a time difference (delta time) from the previous event, which will also be described in more detail later.

The timing count and offset logic 22 is to produce data showing overall timing of each event based on the delta timing data from the event memory 20. Basically, such overall timing data is produced by summing multiple fractional data. During the process of summing the timing data, a carry over operation of the fractional data (offset to the integer data) is also conducted in the timing count and offset logic 22. The more details of such operation will be described later with reference to the example shown in FIGS. 3A–3K and 4.

The event generation and calibration 24 is to actually generate the events based on the overall timing data from the timing count and offset logic 22. The events (test signals and strove signals) thus generated are provided to the DUT 28 through the pin electronics 26. Basically, the pin electronics 26 is formed of a large number of components, each of which is formed of a driver and a comparator as well as switches to establish input and output relationships with respect to the DUT 28.

Figure 4:
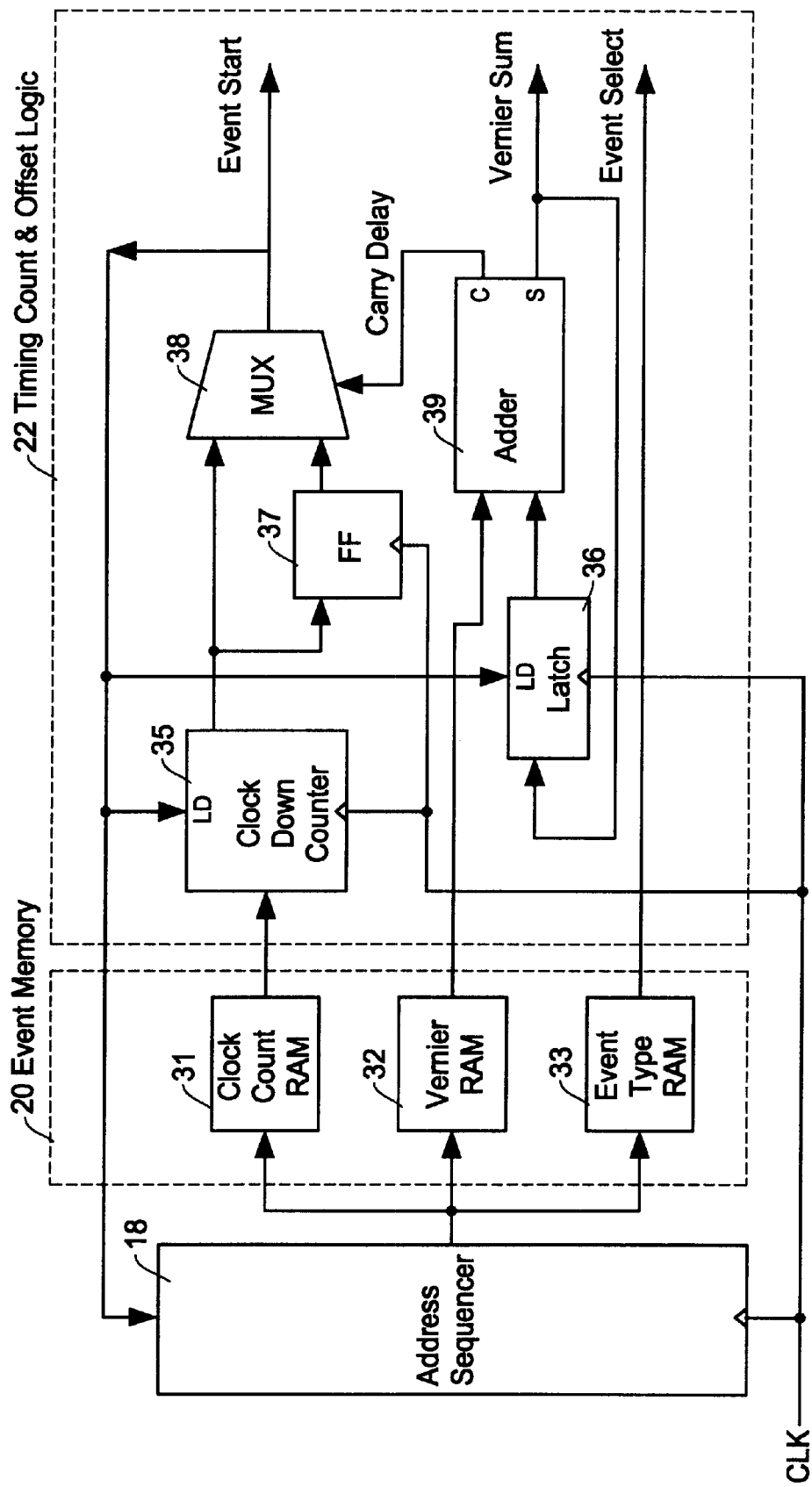
FIG. 4 is a schematic block diagram showing an example of circuit structure for producing overall timing data based on the delta time data from the event memory showing time differences from previous events.
Figure 5:
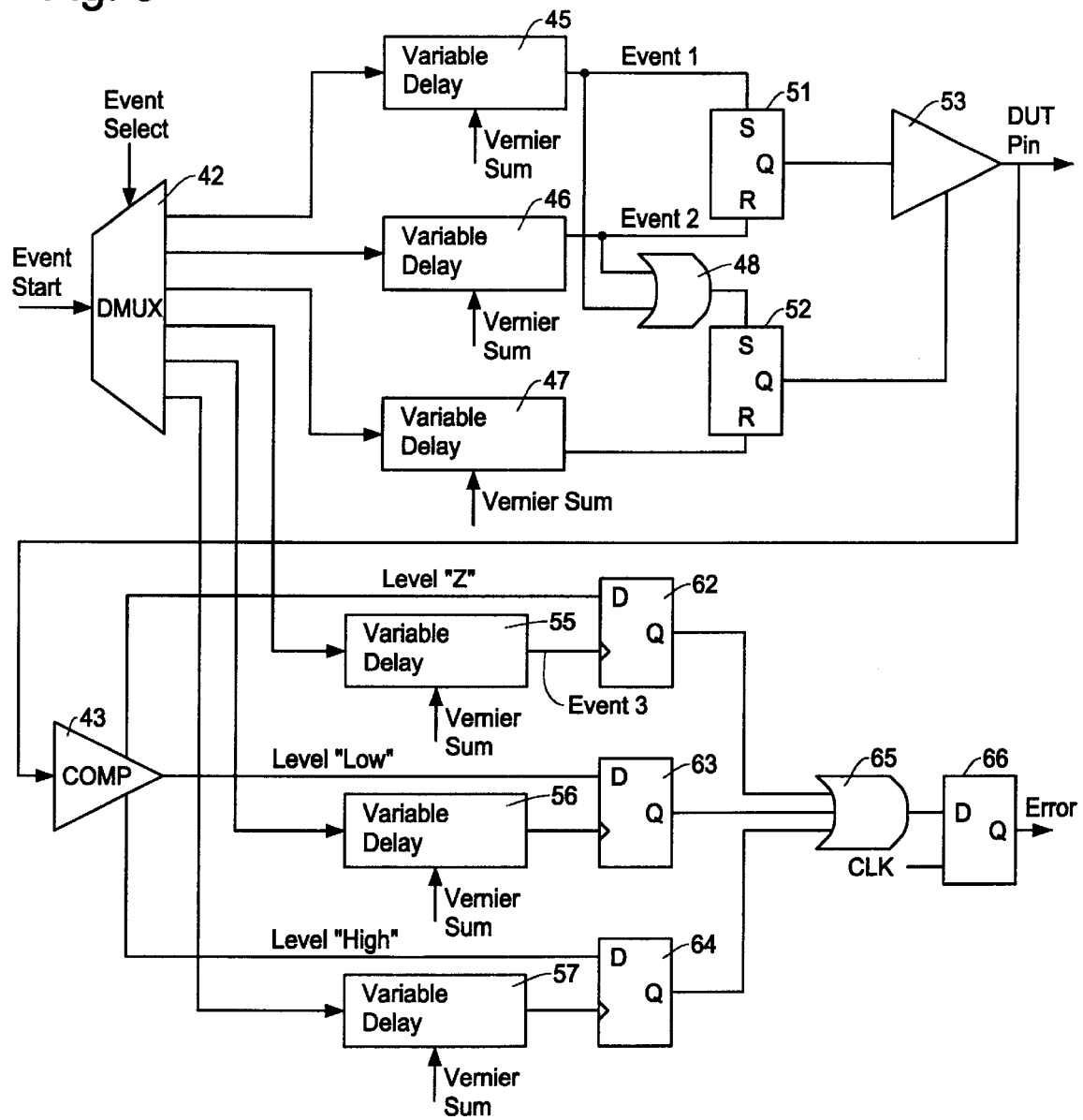
FIG. 5 is a schematic block diagram showing an example of circuit structure for generating various events based on the overall timing data produced by the circuit diagram of FIG. 4.

The more detailed structure and operation of the delta time event based test system is described with reference to FIGS. 3A–3K and FIGS. 4 and 5. FIG. 4 is a circuit diagram showing an example of structure in the event memory 20 and the timing count and offset logic 22 for producing overall timing data based on the delta timing data from the event memory 20 showing time differences from previous events. FIG. 5 is a schematic block diagram showing an example of circuit structure of the event generation and calibration 24 for generating various events at the timing defined by the overall timing data from the circuit diagram of FIG. 4.

The address sequencer 18 supplies address data to the event memory 20. In the simplest case, the address sequencer 18 is an address counter. This address counter would start at a count of zero and increment sequentially by one until a preset stop address is detected. The number of bits wide depends upon the depth of the event memory to be supported, however, in an actual implementation, 16 bits would be the minimum requirements.

In the example of FIG. 4, the event memory 20 is formed with a clock count RAM 31, a vernier count RAM 32, and an event type RAM 33. The clock count RAM 31 stores the integral clock part of the timing data, i.e., the integer multiple of the reference clock interval. The vernier count RAM 32 stores fractional clock part (vernier) of the timing data, i.e., the fractions of the reference clock interval. The event type RAM stores the data for selecting event types. The event type is a selection of setting the tester output pin signals (test signals) to a logic "1", "0" or "high impedance", or setting type of expected data for latching the response signals from the DUT 28 at the timings of the strobe signals.

Figures 6, 7:
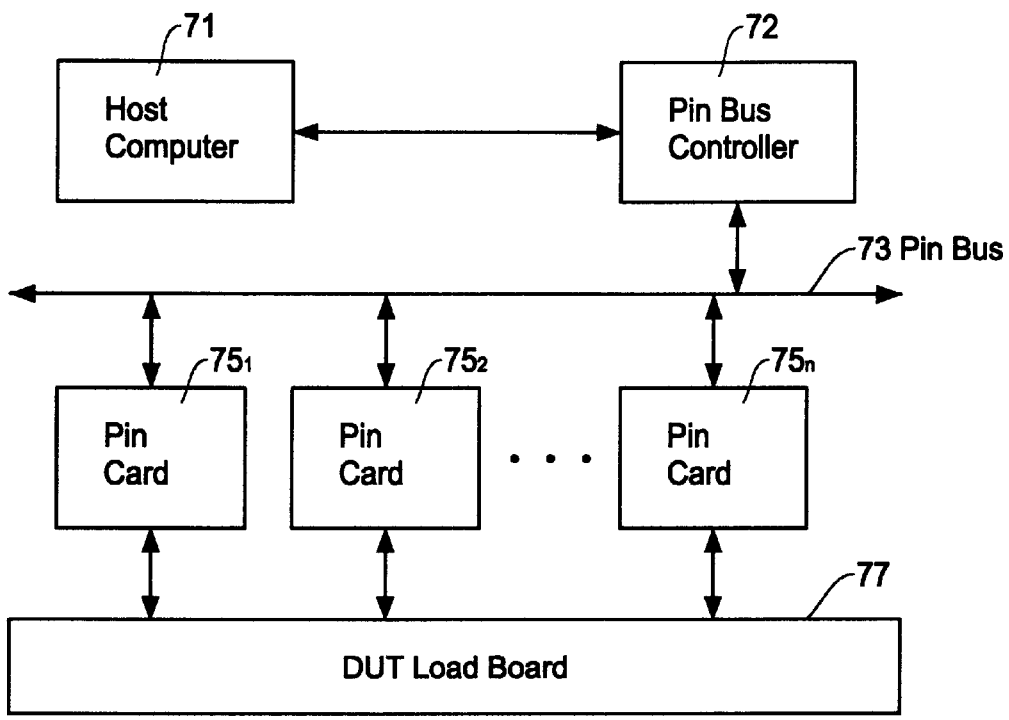
FIG. 6 is a schematic diagram showing a basic system configuration of the event based test system of the present invention.
FIG. 7 is a data table showing relationships among various timings for generating the events shown in FIGS. 3I–3K with use of circuit diagrams of FIGS. 4 and 5.

For generating the events in the example of FIGS. 3I–3K, the data to be stored in the event memory 20 is shown in two left columns of FIG. 7. The timing of Event 1 is 1($3/16$)ns (nanosecond) from a start time as in FIG. 3I. For the Event 1, the timing data in the clock count RAM 31 is "1" while the data in the vernier RAM 32 is $3/16$. The timing of Event 2 is 1($7/16$)ns apart from Event 1 as shown in FIG. 3J. Thus, the timing data in the clock count RAM 31 is "1" while the fraction data in the vernier RAM 32 is $7/16$. Since the timing of Event 3 is 1 ($8/16$)ns after Event 2 as shown in FIG. 3K, the timing data in the clock count RAM 31 is "1" while the fraction data in the vernier RAM 32 is $8/16$.

The data (integral part) in the clock count RAM 31 represents the number of reference (master) clock counts to wait before executing the associated event. The data (fractional part) in the vernier RAM 32 is the number of vernier units to wait after the integral clock counts have expired (event start) to execute the event. The number of bits allocated for the vernier part determines the number of fractional units per clock. In the above example, the number of fractional units is "16".

The vernier sum in FIG. 7 shows the sum of fractional data in the previous events and the present event. For example, the vernier sum for Event 2 is "$10/16$" which is a sum of the vernier count "$3/16$" in Event 1 and the vernier count "$7/16$" in Event 2. The vernier sum for Event 3 is "$18/16$" which is a sum of the vernier count "$3/16$" in Event 1, the vernier count "$7/16$" in Event 2 and the vernier count "$8/16$" in Event 3.

Figure 3:
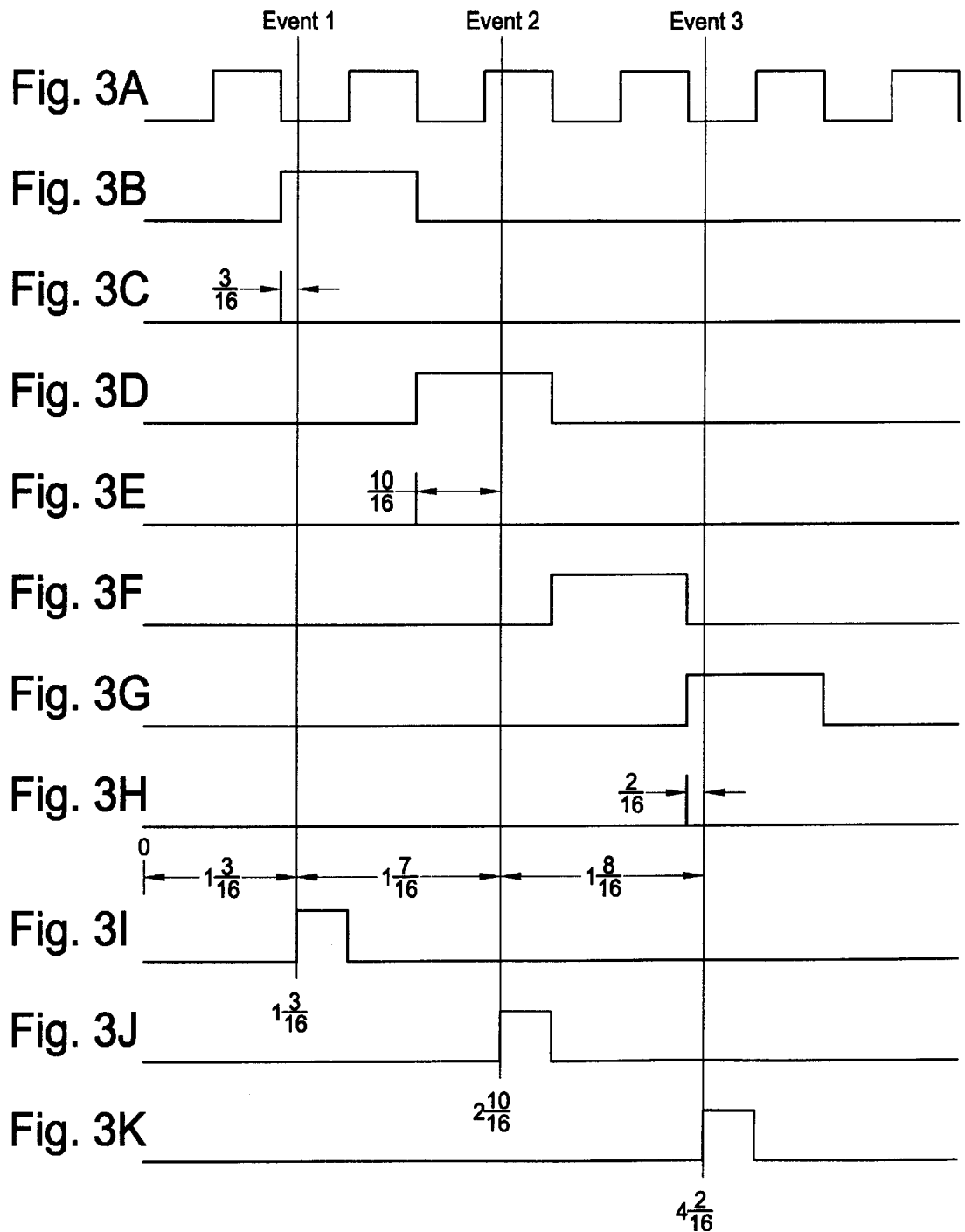
FIGS. 3A–3K are timing charts showing timing relationship among various signals in the event based test system of the present invention.

The total time in the right column of FIG. 7 represents overall timings of the events with reference to the start point "0" in FIG. 3. Such a total time is produced by summing the integral parts of the timing data and the fractional parts of the timing data for all of the previous events and the current event. When the sum of the fractional parts exceeds the unit time interval of the reference clock, the data in the integral part is increased accordingly. The total time of Event 1 is 1($3/16$)ns apart from the start point. The total time of Event 2 is 2($10/16$)ns apart from the start point, while the total time of Event 3 is 4($2/16$)ns apart from the start point.

The timing count and offset logic 22 in FIG. 4 and the event generation and calibration 24 in FIG. 5 produce the events of FIGS. 3I–3K with the timings expressed by the total time in FIG. 7. The timing count and offset logic 22 includes a clock down counter 35, a latch 36, a flip-flop 37, a multiplexer 38 and an adder 39. The clock down counter 35 receives the integral part of the timing data from the clock count RAM 31. The adder 39 receives the fractional part of the timing data from the vernier RAM 32.

For example, the integral part data from the RAM 31 is preset in the down counter 35 and to count down the preset value by the clock reference CLK. When the down counter 35 reaches zero, an output signal (terminal count) is generated which is supplied to one input of the multiplexer 38. Another input of the multiplexer 38 is provided with the output of the flip-flop 37 which generates the output signal of the down counter 35 in the previous events. Thus, the multiplexer 38 inserts an additional clock delay count to the integral part data from the clock count RAM 31. The output of the multiplexer 38 is expressed as an event start which is the number of system clock count values. The event start signal is provided to the event generation and calibration 24 and to the address sequencer 18.

The fractional part data from the vernier RAM 32 is provided to one input terminal of the adder 39. Another input terminal of the adder 39 is provided with the vernier data in the previous event through the latch 36. Thus, the adder 39 adds up all of the fractional part data from the clock count RAM 32. When the sum of the fractional data exceeds one clock count, i.e., $^{16}/_{16}$ in the example of FIGS. 3 and 7 noted above, a carry delay is generated which is given to the multiplexer 38. In receiving the carry delay, the multiplexer 38 delays the output by one reference clock count. Thus, in the example of FIG. 7, the sum of the fractional data is "$^{18}/_{16}$" for Event 3, a carry is provided to the multiplexer 38 to cause an additional delay by one reference clock count in the event start. The remaining data of "$^{2}/_{16}$" is produced at the output of the adder 39 as a vernier sum.

The total time of each event is specified by the total number of whole reference clock count value plus a sum of the fractional portion of the reference clock. Based on the foregoing, the process of generating the Events 1–3 of FIGS. 3I–3K is described with reference to FIGS. 3 and 4. The reference clock (CLK) is shown in FIG. 3A which is provided to the clock down counter 35 and other circuits. Because the integral part data for Event 1 is "1", the down counter 35 produces a pulse (terminal count) of FIG. 3B by counting one clock pulse. The terminal count of FIG. 3B is output as the event start at the output of the multiplexer 38. FIG. 3C shows a vernier sum at the output of the adder 39 to be added to the event start in the event generation and calibration 24, thereby producing Event 1 of FIG. 3I.

Since the integral part data for Event 2 is also "1", the down counter 35 produces a pulse (terminal count) by counting one clock pulse. The terminal count of the down counter 35 is added to the previous terminal count of FIG. 3B by the multiplexer 38, thereby producing the event start shown in FIG. 3D at the output of the multiplexer 38. The event start for Event 2 is delayed by two reference clock counts. FIG. 3E shows a vernier sum at the output of the adder 39 to be added to the event start of FIG. 3D in the event generation and calibration 24. Since the fractional data of Event 1 is "$^{3}/_{16}$" and the fractional data of Event 2 is "$^{7}/_{16}$", the vernier sum at the output of the adder 39 is "$^{10}/_{16}$" which is added to the event start of FIG. 3D, thereby producing Event 2 of FIG. 3J.

Regarding the Event 3, since the integral part data for Event 3 is also "1", the down counter 35 produces a pulse (terminal count) by counting one clock pulse. The terminal count of the down counter 35 is sent to the multiplexer 38, which is in the timing of FIG. 3F, i.e., delayed by three reference clock counts. However, because the vernier sum of "$^{10}/_{16}$" in the previous event is added to the fractional data "$^{8}/_{16}$" of Event 3 by the adder 39, the sum of the fractional data is "$^{18}/_{16}$" for Event 3. Therefore, a carry delay is provided to the multiplexer 38 to cause an additional delay by one clock count in the event start as shown in FIG. 3G. The remaining data of "$^{2}/_{16}$" is produced at the output of the adder 39 as a vernier sum as shown in FIG. 3H. Thus, Event 3 of FIG. 3K is produced by adding the vernier sum of FIG. 3H to the event start of FIG. 3G.

An example of circuit structure in the event generation and calibration 24 is shown in a circuit diagram of FIG. 5. As briefly described in the foregoing, the event generation and calibration 24 of FIG. 5 is to generate test signals and strobe signals based on total time data (event start and vernier sum) provided from the timing count and offset logic of FIG. 4.

The circuit diagram of FIG. 5 includes a demultiplexer 42, a comparator 43, variable delay circuits 45–47, an OR circuit 48, SR flip-flops 51 and 52, a pin driver 53, variable delay circuits 55–57, flip-flops 62–64, an OR circuit 65 and a flip-flop 66. The variable delay circuits 45–47 and 55–57 may be actualized by corresponding event processors (not shown) so that the calibrated delay times are selected by the "vernier sum" from the circuit diagram of FIG. 4. For the convenience of explanation, the pin driver 53 and the comparator 43 are also included in FIG. 5, although these elements may rather be included in the pin electronics 26 of FIG. 2 in an actual implementation.

The output of the pin driver 53 is to provide a test signal to the DUT pin when the DUT pin is an input pin. The desired amplitude and slew rate of the test signal are produced by the pin driver 53. The comparator 43 receives a response output of the DUT when the DUT pin is an output pin. The comparator 43 provides the analog function to compare the analog level of the connected DUT pin with preset voltage ranges and to determine which range the DUT pin resides. The three possible ranges are, level "High", level "Low", and high impedance "Z" as in FIG. 5. In this example, only one of these ranges are active one at time.

The demultiplexer 42 receives the event start from the timing count and offset logic of FIG. 4 and the event type data from the event type RAM 33 in the event memory 20. The event type data is applied to the select terminal of the demultiplexer 42. Thus, the event start signal is demultiplexed to the corresponding event processor having the variable delay circuit specified by the event type.

When the event type data indicates that the current event (Event 1) is "Drive DUT Pin High", the event start signal is sent to the variable delay 45 wherein it is delayed by the time defined by the vernier sum. Thus, the output of the variable delay circuit 45 (Event 1 such as shown in FIG. 3I) sets the SR flip-flop 51. This will cause the pin driver 53 to drive the connected DUT pin to logic one.

When the event type data indicates that the current event (Event 2) is "Drive DUT Pin Low", the event start signal is sent to the variable delay 46 wherein it is delayed by the time defined by the vernier sum. Thus, the output of the variable delay circuit 46 (Event 2 such as shown in FIG. 3J) resets the SR flip-flop 51. This will cause the pin driver 53 to drive the connected DUT pin to logic zero.

When the event type data indicates that the current event is "Turn Off Drive to DUT", the event start signal is sent to the variable delay 47 wherein it is delayed by the time defined by the vernier sum. Thus, the output of the variable delay circuit 47 resets the SR flip-flop 52. This will place the pin driver 53 connected to the DUT pin into a high impedance state to receive the output of the DUT pin by the comparator 43.

When the pin driver 53 is in the high impedance mode to receive the signal from the DUT pin by the comparator 43, the event is typically used to generate the strobe signal to latch the logic of the comparator output. For example, when the event type data indicates that the current event is "Test DUT for High Impedance", the event start signal is sent to the variable delay 55 wherein it is delayed by the time defined by the vernier sum. The voltage level of the DUT pin is compared against a preprogrammed high impedance level by the comparator 43. If the minimum high impedance level is not achieved, the resultant output of the comparator 43 is latched by the strove signal (Event 3) from the variable delay circuit 55 in the flip-flop 62. This data indicates failure of the DUT and is clocked through the OR circuit 65 and the flip-flop 66 and output as "Error".

When the event type data indicates that the current event is "Test DUT for Low", the event start signal is sent to the variable delay 56 wherein it is delayed by the time defined by the vernier sum. The voltage level of the DUT pin is compared against a preprogrammed low level by the comparator 43. If the predetermined low level is not achieved, the resultant output of the comparator 43 is latched at the timing of the strobe signal from the variable delay circuit 56 in the flip-flop 63. This data indicates failure of the DUT and is clocked through the OR circuit 65 and the flip-flop 66 and output as "Error".

When the event type data indicates that the current event is "Test DUT for High", the event start signal is sent to the variable delay 57 wherein it is delayed by the time defined by the vernier sum. The voltage level of the DUT pin is compared against a preprogrammed high by the comparator 43. If the predetermined high level is not achieved, the resultant output of the comparator 43 is latched at the timing of the strobe signal from the variable delay circuit 57 in the flip-flop 63. This data indicates failure of the DUT and is clocked through the OR circuit 65 and the flip-flop 66 and output as "Error".

FIG. 6 is a schematic diagram showing a system configuration of an event based test system of the present invention. With the architecture of the single pin (or per pin) event tester of a simple system for loading the event data, several pin event testers (pin cards $75_1$–$75_n$) can easily be established. Each of pin cards are connected via a pin bus 73, where each pin card 75 is individually addressable by the pin bus controller 72. The pin bus controller 72 is connected to a host computer 71 running the test controller software. The pin bus controller 72 provides services of starting, stopping, test results, event data loading and sequencing pins together via global pin bus signals. This architecture allows an "N" pin test system to be built.

According to the present invention, the event based semiconductor test system is capable of producing the test signals and strobes based on the event data stored in the event memory to evaluate the semiconductor device. The timing of each of the events is defined by a difference of time length (delta time) from the last event. The test signals and strobes are produced based on event information whose delta time from the previous event is defined by a combination of an integer multiple of the reference clock period and a fraction of the reference clock period.

The event based semiconductor test system of the present invention can produce test signals and strobes directly with use of timing data in the event memory. Since the timing data represents the delta time between two adjacent events, the size of each data can be small, resulting in the substantial reduction in the capacity of the event memory. The event based semiconductor test system of the present invention is capable of directly using data produced by a test bench of a CAD system in the design stage of the semiconductor device under test for generating test signals and strobes.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. An event based test system for testing an electronics device under test (DUT) by supplying a test signal to the DUT and evaluating an output of the DUT at a timing of a strobe signal, comprising:

an event memory for storing timing data of each event formed with an integer multiple of a reference clock period (integral part data) and a fraction of the reference clock period (fractional part data) and information indicating a type of event to be generated by said event based test system, said timing data being a time difference between two adjacent events, where events are defined as any changes in a signal generated by said test system for testing the DUT at timings relative to a predetermined reference point which is a fixed timing point common to all of the events and wherein said reference point is unrelated to test cycles used in traditional test systems;

an address sequencer for generating address data for accessing said event memory to read out said timing data therefrom;

a timing count logic for summing said timing data to produce an overall time of each event relative to said predetermined reference point, said timing count logic including a delay means for adding one reference clock period every time when a sum of said fraction exceeding said reference clock period;

an event generation circuit for generating each event based on said overall time and said information on said event type for formulating said test signal or strobe signal; and a host computer for controlling an overall operation of said event based test system through a test program.

2. An event based test system as defined in claim 1, further comprising a failure memory for storing failure information of said DUT resulted from applying said test signals to said DUT and comparing response outputs of said DUT with expected value at the timing of said strobe signals.

3. An event based test system as defined in claim 1, further comprising a pin electronics circuit between said event generation circuit and said DUT for driving said test signals in a predetermined condition before supplying said test signals to said DUT and receiving said response outputs of the DUT.

4. An event based test system as defined in claim 1, wherein said event memory is a semiconductor memory including a random access memory (RAM).

5. An event based test system as defined in claim 1, wherein said event memory is comprised of:

a clock count memory for storing said integral part data of said timing data of each event;

a vernier memory for storing said fractional part data of said timing data of each event; and an event type memory for storing data representing a type of each event corresponding to said timing data in said clock count memory and vernier memory.

6. An event based test system as defined in claim 1, wherein said timing count logic for summing said timing data is comprised of;

a down counter for presetting said integral part data therein and down counting said integral part data by said reference clock for producing a delay time which is an integer multiple of said reference clock period;

a multiplexer for transmitting said integer multiple delay time from the down counter and for inserting one clock delay time in the integer multiple delay time, thereby producing an event start signal; and an adder for adding said fractional part data of a current event from said event memory to fractional part data of previous events, thereby producing a vernier sum data, said adder generating a carry signal every time when the result of adding said fractional part data exceeding said reference clock period;

wherein said multiplexer produces an additional delay equal to said reference clock period every time when receiving said carry signal from said adder.

7. An event based test system as defined in claim 6, said timing count logic further comprising a flip-flop for loading said integer multiple delay time of said previous event to said multiplexer, and a latch circuit for loading said vernier sum data of said previous event to said adder.

8. An event based test system as defined in claim 6, wherein said event generation circuit is comprised of;
- a demultiplexer for selectively providing said event start signal from said timing count logic based on event type data from said event memory;
- a plurality of variable delay circuits for receiving said event start signal from said demultiplexer, each of said variable delay circuits providing an additional delay defined by said vernier sum data from said timing count logic to said event start signal;
- means for producing said test signals based on output signals of at least two of said variable delay circuits; and
- means for producing said strobe signals based on an output signal of at least one of said variable delay circuits.

* * * * *